(12) United States Patent
Kohamada (10) Patent No.: US 6,456,147 B1
(45) Date of Patent: Sep. 24, 2002

(54) OUTPUT INTERFACE CIRCUIT (75) Inventor: Hiroyuki Kohamada, Kumamoto (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/940,056

(22) Filed: Aug. 27, 2001

(30) Foreign Application Priority Data

Aug. 28, 2000 (JP) ........................................ 2000-258036

(51) Int. Cl.⁷ .............................................. H03K 17/62
(52) U.S. Cl. .................... 327/407; 327/333; 327/99; 327/538; 326/63; 326/80
(58) Field of Search ................................ 327/333, 403, 327/407, 415, 530, 535, 538, 544, 99; 326/80, 81, 63; 365/189.05, 189.09, 226, 189.11; 330/157

(56) References Cited

U.S. PATENT DOCUMENTS 5,534,801 A * 7/1996 Wu et al. ...................... 326/81
5,712,586 A * 1/1998 Kitao ............................ 326/80
6,031,413 A * 2/2000 Mizoguchi ................... 323/313

* cited by examiner

Primary Examiner—Timothy P. Callahan
Assistant Examiner—Minh Nguyen (57) ABSTRACT

An output interface circuit realizes a fast and stable interface operation without any chip-size increase even if the external supply voltage varies within a specific range (e.g., from 5 V to 3.3 V or from 5 V to 2 V). The output interface circuit comprises a first and a second output buffer circuit for receiving an output signal of an internal circuit, and an output-level adjusting circuit for receiving the output signal of the second output buffer circuit, for level-adjusting the output signal, and for outputting the level-adjusted output signal to an external output terminal. The first or second output buffer circuit outputs a signal based on the value of an external supply voltage.

13 Claims, 7 Drawing Sheets

OUTPUT INTERFACE CIRCUIT

BACKGROUND OF THE INVENTION

1. Field of the Invention

The present invention relates to an output interface circuit and more particularly, to an output interface circuit to be placed between an internal circuit or circuits and an external terminal, which is used as an interface circuit for/in outputting an output signal of the internal circuit or circuits to the external output terminal.

2. Description of the Related Art

In recent years, the need to increase the integration scale of electronic elements/components on a semiconductor integrated circuit device (which is referred as a "LSI" hereinafter) and to reduce the power consumption thereof has become stronger. To meet the need, various techniques have been developed to lower the supply voltage for a LSI from popular 5 V to a lower one such as 3.3 V or 2 V.

A LSI is usually built into an external device or apparatus and therefore, a LSI is supplied with its supply voltage from the external device/apparatus. In this case, the LSI is supplied with a conventional supply voltage of 5 V or a recent one of 3.3 V or 2 V. This means that the value of the supply voltage for a LSI varies dependent on what value of voltage an external device/apparatus supplies to a LSI incorporated. Taking this fact into consideration, a proper contrivance needs to be provided in such a way that a LSI operates normally not only at a higher supply voltage of 5 V but also at a lower one of 3.3 V or 2 V.

Recently, when the designed supply voltage of a LSI is 3.3 or 2 V, a voltage-lowering circuit has been often provided in the power supply circuit of a LSI to lower the incoming supply voltage of 5 V to 3.3 or 2 V. In this case, a desired supply voltage of 3.3 or 2 V is produced by the voltage-lowering circuit built in the LSI and then, it is supplied to the internal circuit(s) thereof.

In this specification, a supply voltage (e.g., 3.3 or 2 V) generated and supplied inside a LSI itself is termed an "internal supply voltage" while a supply voltage (e.g., 5 V) supplied from an external device/apparatus located outside the LSI is termed an "external supply voltage". Moreover, a circuit for generating an "internal supply voltage" inside a LSI is termed an "internal power supply circuit" while a circuit for generating an "external supply voltage" in an external device/apparatus located outside the LSI is termed an "external power supply circuit".

Some prior-art output interface circuits of this type are capable of normal operation at both an internal supply voltage of 3.3 V or 2 V and an external supply voltage of 5 V. These circuits are termed "voltage tolerant circuits", an example of which is shown in FIG. 1.

Figure 1:
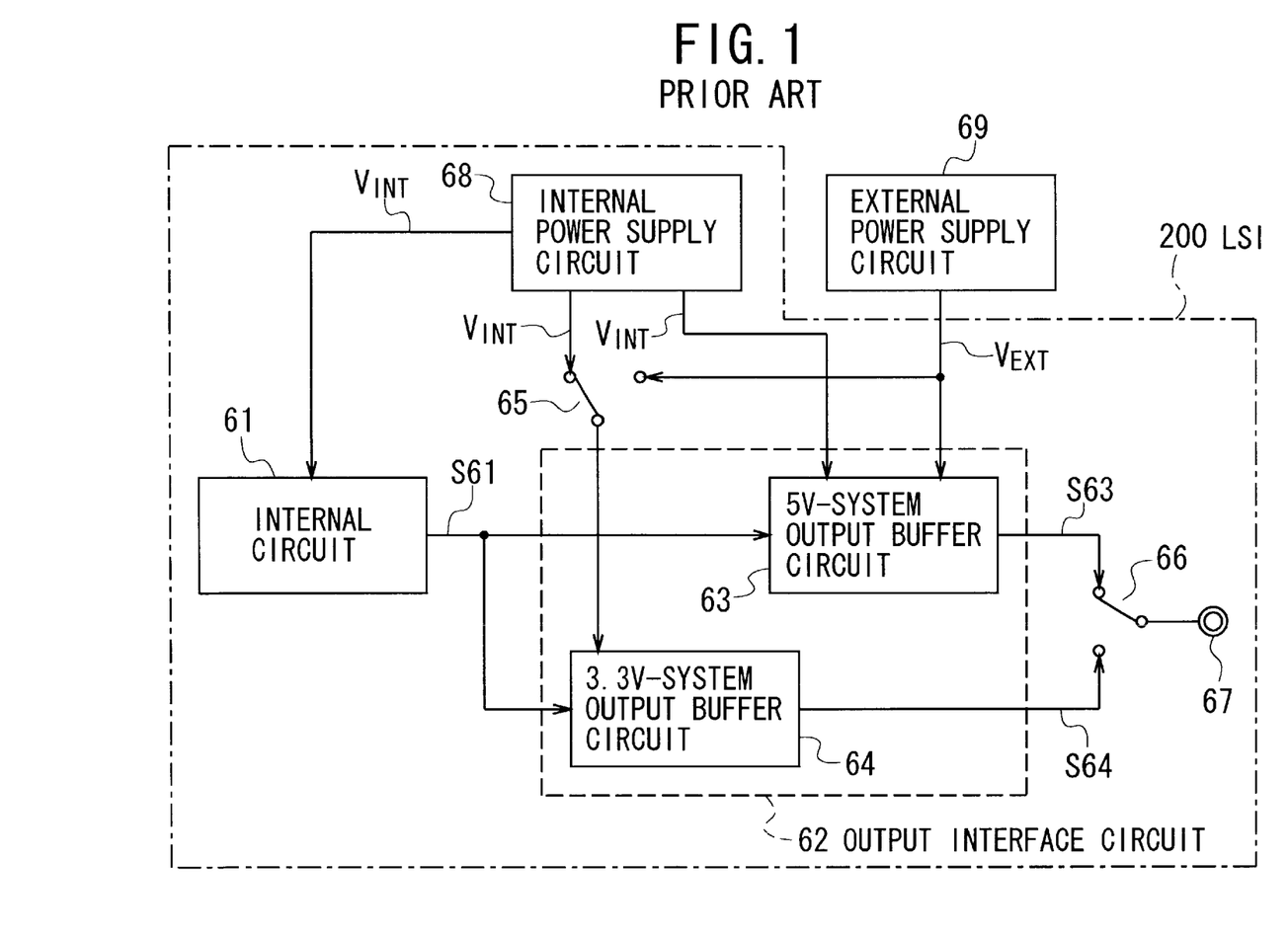
FIG. 1 is a functional block diagram showing the main part of a prior-art LSI including a prior-art output interface circuit.

In FIG. 1, a prior-art LSI 200 is incorporated into a specific external device or apparatus (not shown). Only an external power supply circuit 69 of the external device is shown in FIG. 1 for simplification of illustration.

Practically, the prior-art LSI 200 comprises various internal circuits to realize its specific functions. However, only one of the internal circuits is shown in FIG. 1 with the reference numeral 61 for simplification. Although the LSI 200 comprises practically various external terminals for outputting its output signals, only one of them is shown in FIG. 1 with the reference numeral 67. The terminal 67 is used to derive an output signal S61 of the internal circuit 61 (i.e., the LSI 200). The LSI 200 further comprises a prior-art output interface circuit 62 and an internal power supply circuit 68.

The output interface circuit 62 provides a specific interface function between the internal circuit 61 and the external output terminal 67. The internal power supply circuit 68 supplies a specific internal supply voltage $V_{INT}$ (=3.3 V) to the inside of the LSI 200 including the internal circuit 61 and the output interface circuit 62.

The external power supply circuit 69, which is incorporated into the external device, is located outside the LSI 200. The circuit 69 supplies a specific external supply voltage $V_{INT}$ (=5 V or 3.3 V) to the inside of the LSI 200 including the output interface The output interface circuit 62 comprises a 5V-system output buffer circuit 63 that provides its optimum operation at a supply voltage of 5 V and a 3.3V-system output buffer circuit 64 that provides its optimum operation at a supply voltage of 3.3 V. These two buffer circuits 63 and 64 are alternately activated or used dependent on the current value (5 V or 3.3 V) of the external supply voltage $V_{EXT}$ supplied by the external power supply circuit 69.

The internal circuit 61 is supplied with the internal supply voltage $V_{INT}$ (3.3 V) from the internal power supply circuit 68. The 5V-system output buffer circuit 63 is supplied with the external supply voltage $V_{EXT}$ (5 V or 3.3 V) from the external power supply circuit 69 and the internal supply voltage $V_{INT}$ (3.3 V) from the internal power supply circuit 68. The 3.3V-system output buffer circuit 64 is supplied with the external supply voltage $V_{EXT}$ (5 V or 3.3 V) or the internal supply voltage $V_{INT}$ (3.3 V) by way of a switch 65.

The output signal S61 of the internal circuit 61 is applied to both the 5-system output buffer circuit 63 and the 3.3V-system output buffer circuit 64. In response to the signal S61, the 5V-and 3.3V-system output buffer circuits 63 and 64 output their output signals S63 and S64, respectively. One of the signals S63 and S64 is sent to the external output terminal 67 by way of a switch 66.

Metal-Oxide-Semiconductor Field-Effect Transistors (MOSFETS) that constitute the 5V-system output buffer circuit 63 are different in characteristics from those that constitute the 3.3V-system output buffer circuit 64. Specifically, the maximum supply voltage applied to the circuit 63 is greater than that applied to the circuit 64. Thus, the gate insulator thickness of the MOSFETs of the circuit 63 is larger than that of the circuit 64 and at the same time, the logic threshold of the MOSFETs of the circuit 63 is higher than that of the circuit 64.

Due to the characteristic difference, when the external supply voltage $V_{EXT}$ is 5 V, the switch 66 is controlled to interconnect the 5V-system output buffer circuit 63 to the external output terminal 67 and at the same time, the switch 65 is controlled to interconnect the 3.3V-system output buffer circuit 64 to the internal power supply circuit 68. As a result, the output signal S63 of the circuit 63 operable at the external supply voltage $V_{EXT}$ of 5 V is derived from the output terminal 67. The output signal S64 of the circuit 64 operable at the internal supply voltage $V_{INT}$ of 3.3 V is not sent to the output terminal 67.

When the external supply voltage $V_{EXT}$ is 3.3 V, the switch 66 is controlled to interconnect the 3.3V-system output buffer circuit 64 to the external output terminal 67 and at the same time, the switch 65 is controlled to interconnect the 3.3V-system output buffer circuit 64 to the external power supply circuit 69. As a result, the output signal S64 of the circuit 64 operable at the external supply voltage $V_{EXT}$ of 3.3 V is derived from the output terminal 67. The output signal S63 of the circuit 63 is not sent to the output terminal 67. This is because the external supply voltage $V_{EXT}$ of 3.3 V is supplied to the circuit 63 and thus, the signal S63 has undesired characteristics.

As explained above, with the prior-art LSI 200 of FIG. 1, when the external supply voltage $V_{EXT}$ is 5 V, the output signal S63 of the 5V-system buffer circuit 63 operable optimally at 5 V is derived from the output terminal 67. When the external supply voltage $V_{EXT}$ is 3.3 V, the out put signal S64 of the 3.3V-systembuffer circuit 64 operable optimally at 3.3 V is derived from the output terminal 67. Thus, an optimum interface operation is provided independent of whether the external supply voltage $V_{EXT}$ is 5 V or 3.3 V.

The switches 65 and 66 are usually formed with wiring lines made of conductive material such as aluminum (Al), not with the use of transistors. In detail, the switches 65 and 66 are usually realized by changing the interconnection of the wiring lines (i.e., changing the mask patterns for the wiring lines) dependent on the value (i.e., 5 V or 3.3 V) of the external supply voltage $V_{EXT}$.

With the prior-art output interface circuit 62 described above with reference to FIG. 1, there are two problems described below.

First, when the external supply voltage $V_{EXT}$ is 5 V, the 5V-system output buffer circuit 63 is connected to external output terminal 67 by way of the switch 66. Thus, the circuit 63 provides its interface operation even if the voltage $V_{EXT}$ varies between 5 V and 3.3 V or between 5 V and 2 V. On the other hand, as explained above, the gate insulator thickness of the MOSFETs of the 5V-system circuit 63 is larger than that of the 3.3V-system circuit 64 and the logic threshold of the MOSFETs of the circuit 63 is higher than that of the circuit 64. Therefore, if the voltage $V_{EXT}$ is lowered to near 3.3 V or 2 V, the delay time of the output signal S63 of the circuit 63 tends to increase abruptly, resulting in incapability of a desired fast and stable interface operation.

For example, when the prior-art LSI 200 is driven by a battery, the external supply voltage $V_{EXT}$ is inclined to fluctuate between 5 V and 3.3 V or between 5 V and 2 V. This is because the designed output voltage (=5 V) of a battery usually fluctuates dependent on the total time of use and/or the loaded condition, and because the output voltage tends to lower gradually from 5 V during the operation of the LSI 200 due to discharge.

Second, the switching operation between the 5V- and 3.3V-system output buffer circuits 63 and 64 is realized by changing the interconnection (i.e., the mask pattern) of the wiring lines dependent on a required value (i.e., 5 V or 3.3r V) of the external supply voltage $V_{EXT}$. Therefore, these circuits 63 and 64 are unable to be switched in response to the value change of the voltage $V_{EXT}$ after the interconnection is once determined.

If the switches 65 and 66 are formed with the use of transistors, the second problem can be solved. In this case, however, the size of the transistors will be excessively large in order to keep the desired buffering characteristics of the circuits 63 and 64. In other words, the total chip area of the switches 65 and 66 will be equal to or greater than that of the circuits 63 and 64 themselves. Thus, there arises another problem of chip-size increase of the LSI 200.

SUMMARY OF THE INVENTION

Accordingly, an object of the present invention is to provide an output interface circuit that realizes a desired fast and stable interface operation without any chip-size increase even if the external supply voltage varies within a specific range (e.g., from 5 V to 3.3 or from 5 V to 2 V).

Another object of the present invention is to provide an output interface circuit that prevents a voltage exceeding the current external supply voltage from being applied to the external output terminal when the external supply voltage is lower than the internal supply voltage.

Still another object of the present invention is to provide n output interface circuit that prevents a voltage exceeding the internal supply voltage from being applied to a buffer circuit for a lower voltage (e.g., 3.3 V) when a buffer circuit for a higher voltage (e.g., 5 V) is used or activated.

The above objects together with others not specifically mentioned will become clear to those skilled in the art from the following description.

An output interface circuit according to the present invention comprises:

(a) a first output buffer circuit for receiving an output signal of an internal circuit to output a first output signal;

(b) a second output buffer circuit for receiving the output signal of the internal circuit to output a second output signal; and (c) an output-level adjusting circuit for receiving the second output signal outputted from the second output buffer circuit and for adjusting a level of the second output signal thus received to output a third output signal corresponding to the level-adjusted second output signal to an external output terminal;

wherein the first output buffer circuit outputs the first output signal to the external output terminal responsive to a first control signal that represents an external supply voltage having a first relationship with a specific value; and wherein the second output buffer circuit outputs the second output signal to the output-level adjusting circuit responsive to a second control signal that represents the external supply voltage having a second relationship with the specific value opposite to the first relationship.

With the output interface circuit according to the present invention, (a) the first output buffer circuit for receiving the output signal of the internal circuit to output the first output signal; (b) the second output buffer circuit for receiving the output signal of the internal circuit to output the second output signal; and (c) the output-level adjusting circuit for receiving the second output signal outputted from the second output buffer circuit and for adjusting the level of the second output signal thus received to output the third output signal corresponding to the level-adjusted second output signal to the external output terminal are provided.

Moreover, the first output buffer circuit outputs the first output signal to the external output terminal responsive to the first control signal that represents the external supply voltage having the first relationship with the specific value. The second output buffer circuit outputs the second output signal to the output-level adjusting circuit responsive to the second control signal that represents the external supply voltage having the second relationship with the specific value opposite to the first relationship.

Therefore, when the external supply voltage has the first relationship with the specific value, the first output buffer circuit outputs the first output signal to the external output terminal responsive to the first control signal. On the other hand, when the external supply voltage has the second relationship with the specific value opposite to the first relationship, the second output buffer circuit outputs the second output signal to the output-level adjusting circuit responsive to the second control signal. Then, the output-level adjusting circuit outputs the third output signal to the external output terminal.

As a result, for example, if the external supply voltage is higher than the specific value, the first output signal, which corresponds to the output signal of the internal circuit, is outputted to the external output terminal by the first output buffer circuit. If the external supply voltage is not higher than the specific value, the second output signal, which corresponds to the output signal of the internal circuit, is outputted to the external output terminal by the second output buffer circuit. Thereafter, the third output signal corresponding to the level-adjusted second output signal is outputted to the external output terminal by the output-level adjusting circuit. Accordingly, even if the external supply voltage varies within a specific range (e.g., from 5 V to 3.3or from 5V to 2 V), a desired fast and stable interface operation is realized.

Moreover, which one of the first and second output signals is used dependent on the first or second relationship of the external supply voltage is controlled with the first and second control signals. Thus, there is no need to provide a transistor switch for switching from the first output signal to the second one and vice versa. This means that chip-size increase is prevented.

In a preferred embodiment of the circuit according to the invention, the output-level adjusting circuit has a function of equalizing a voltage level of the third output signal to the external supply voltage when the external supply voltage is lower than an internal supply voltage. In this embodiment, there is an additional advantage that a voltage higher than the external supply voltage is prevented from being outputted to the external output terminal when the external supply voltage is lower than the internal supply voltage.

In another preferred embodiment of the circuit according to the invention, the output-level adjusting circuit has a function of adjusting a voltage level of the third output signal to be lower than an internal supply voltage. In this embodiment, there is an additional advantage that a voltage higher than the internal supply voltage is prevented from being applied to the second output buffer circuit when the first output buffer circuit is used.

In still another preferred embodiment of the circuit according to the invention, the first output signal outputted from the first output buffer circuit is approximately equal to the external supply voltage while the second output signal outputted from the second output buffer circuit is approximately equal to an internal supply voltage. In this embodiment, it is preferred that the third output voltage outputted from the output-level adjusting circuit is approximately equal to the external supply voltage.

In a further preferred embodiment of the circuit according to the invention, the first and second control signals are respectively sent to the first and second output buffer circuits by way of a register that stores a data on a current state of the external supply voltage.

In a still further preferred embodiment of the circuit according to the invention, the first and second control signals are respectively sent to the first and second output buffer circuits by way of a voltage detection circuit for continuously detecting a state of the external supply voltage.

BRIEF DESCRIPTION OF THE DRAWINGS

In order that the present invention may be readily carried into effect, it will now be described with reference to the accompanying drawings.

DETAILED DESCRIPTION OF THE PREFERRED EMBODIMENTS

Preferred embodiments of the present invention will be described in detail below while referring to the drawings attached.

FIRST EMBODIMENT

Figure 2:
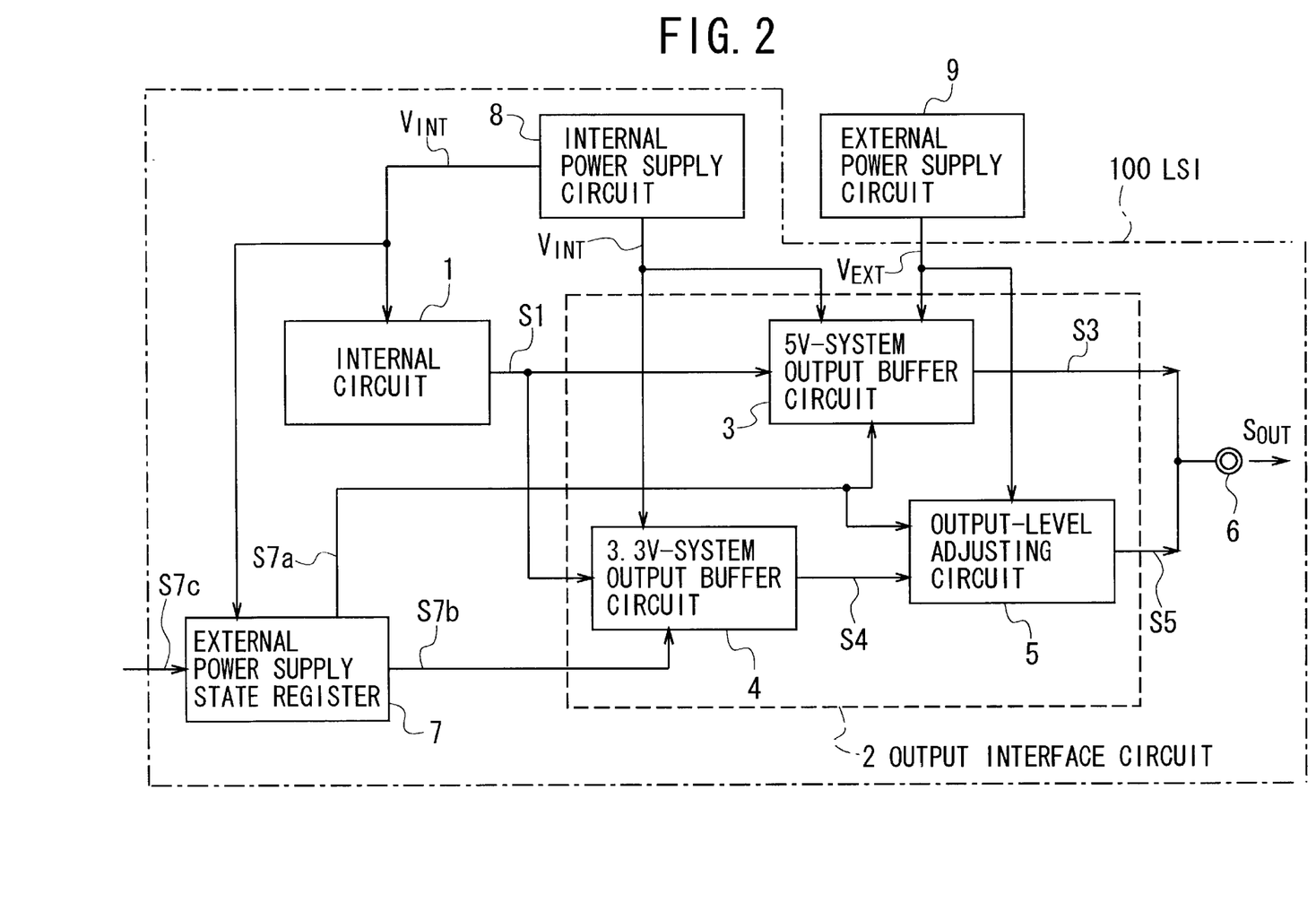
FIG. 2 is a functional block diagram showing the main part of a LSI including an output interface circuit according to a first embodiment of the invention.

As shown in FIG. 2, a LSI 100 includes an output interface circuit 2 according to a first embodiment of the invention. The LSI 100 is incorporated in a specific external device or apparatus (not shown). Only an external power supply circuit 9 of the external device is illustrated in FIG. 2 for simplification. The circuit 9, which is incorporated into the external device and located outside the LSI 100, supplies a specific external supply voltage $V_{EXT}$ to the inside of the LSI 100.

The LSI 100 practically has a plurality of internal circuits to realize its specific functions. However, only one of the internal circuits is shown in FIG. 2 with the reference numeral 1. Although the LSI 100 comprises various external terminals for outputting its output signals, only one of them is shown in FIG. 2 with the reference numeral 6. The terminal 6 is used to derive an output signal S1 of the internal circuit 1 (i.e., the LSI 100). The LSI 100 further comprises the output interface circuit 2 of the first embodiment, an external power supply state register 7, and an internal power supply circuit 8.

The output interface circuit 2 provides a specific interface function between the internal circuit 1 and the external output terminal 6. The external power supply state register 7 stores the information or data that represents the current state of the external supply voltage $V_{EXT}$. The internal power supply circuit 8 supplies a specific internal supply voltage $V_{INT}$ to the inside of the LSI 100 including the internal circuit 1, the register 7, and the circuit 2.

The internal supply voltage $V_{INT}$ supplied by the internal power supply circuit 8 is kept at a specific value (here, 3.3 V). The external supply voltage $V_{EXT}$ supplied by the external power supply circuit 9 is set at a specific value (here, 5 V). Unlike the internal supply voltage $V_{INT}$, the external supply voltage $V_{EXT}$ has a possibility that it fluctuates within the range from 5 V to 3.3 V.

The external power supply state register 7 outputs two control signals S7a and S7b showing the current state of the external supply voltage $V_{EXT}$, i.e., whether the value of the voltage $V_{EXT}$ is in the neighborhood of 5 V (i.e., it is a 5V-system voltage) or in the neighborhood of 3.3 V (i.e., it is a 3.3V-system voltage). The information or data on whether the voltage $V_{EXT}$ is equal to approximately 5 V or 3.3 V needs to be written into the register 7, which is carried out by any known method. Here, the information on whether the voltage $V_{EXT}$ is equal to approximately 5 V or 3.3 V is preferably written or stored into the register 7 by sending a specific writing or storing signal S7c to the register 7 from the external device. However, any other method can be taken if the register 7 outputs the signals S7a and S7b dependent on the content of the signal S7c.

The internal circuit 1 operates under application of the internal supply voltage $V_{INT}$ from the internal power supply circuit 8. The register 7 also operates under application of the internal supply voltage $V_{INT}$ from the circuit 8.

The 5V-system output buffer circuit 3 of the output interface circuit 2 is connected to the internal and external power supply circuits 8 and 9. The circuit 3 operates alternately under application of the internal supply voltage $V_{INT}$ from the circuit 8 or the external supply voltage $V_{EXT}$ from the circuit 9. The circuit 3 receives the output signal S1 of the internal circuit 1 and outputs a corresponding signal S3 to the external output terminal 6. The output operation of the signal S3 is carried out responsive to the control signal S7a for enabling the 5V-system buffer circuit 3 sent from the register 7. The control signal S7a is sent to the output-level adjusting circuit 5 too.

The 3.3V-system output buffer circuit 4 of the output interface circuit 2 is connected to the internal power supply circuit 8, which is not connected to the external power supply circuit 9. The circuit 4 operates under application of the internal supply voltage $V_{INT}$ from the circuit 8. The circuit 4 receives the output signal S1 of the internal circuit 1 and outputs a corresponding signal S4 to the signal Si to the output-level adjusting circuit 5. The output operation of the signal S4 is carried out responsive to the control signal S7b for enabling the 3.3V-system buffer circuit 4 sent from the register 7. The control signal S7b is not sent to the circuit 5, which is unlike the control signal S7a.

The output-level adjusting circuit 5 is connected to the external power supply circuit 9, which is not connected to the internal power supply circuit 8. The circuit 5 operates under application of the external supply voltage $V_{EXT}$ from the circuit 9. The circuit 5 receives the output signal S4 of the 3.3V-system buffer circuit 4 and outputs a corresponding signal S5 to the signal S4 to the external output terminal 6.

The first purpose of the output-level adjusting circuit 5 is to adjust or control the value of the output signal S5 of the circuit 5 not to exceed the current value of the external supply voltage $V_{EXT}$ when the external supply voltage $V_{EXT}$ is equal to or lower than the internal supply voltage $V_{INT}$ (=3.3 V). The second purpose of the circuit 5 is to prevent the external supply voltage $V_{EXT}$ (=5 V) from being applied to the output terminal of the 3.3-V system buffer circuit 4 when the external supply voltage $V_{EXT}$ is in the neighborhood of 5 V and thus, the 5-V system buffer circuit 3 is activated or used for sending the output signal S1 of the internal circuit 1 to the external output terminal 6.

The external power supply state register 7 outputs complementarily the control signal S7a for representing the external supply voltage $V_{EXT}$ being in the 5V-system voltages (i.e., 5 V or its neighborhood) or the control signal S7b for representing the external supply voltage VET being in the 3.3V-system voltages (i.e., 3.3 V or its neighborhood). In other words, the register 7 outputs alternately the control signal S7a or S7b responsive to the current state or value of the voltage $V_{EXT}$. As a result, either the output signal S3 of the 5V-system buffer circuit 3 or the output signal S5 of the output-level adjusting circuit 5 is sent to the external output terminal 6 and the, it is outputted to the outside of the LSI 100 as its output signal $S_{OUT}$.

With the output interface circuit 2 according to the first embodiment of the invention, as described above, the 5V-system output buffer circuit 3 outputs the output signal S3 to the external output terminal 6 responsive to the control signal S7a that represents the external supply voltage $V_{EXT}$ being in the neighborhood of 5 V. On the other hand, the 3.3V-system output buffer circuit 4 outputs the output signal S4 to the output-level adjusting circuit 5 responsive to the control signal S7b that represents the external supply voltage $V_{EXT}$ being in the neighborhood of 3.3 V. Thereafter, the output-level adjusting circuit 5 outputs the level-adjusted one of the output signal S4 to the external terminal 6 as the output signal S5 responsive to the control signal S7a.

Therefore, when the external supply voltage $V_{EXT}$ is in the neighborhood of 5 V, the output signal S5 of the 5V-system output buffer circuit 3 is derived from the external output terminal 6 as the output signal $S_{OUT}$. When the external voltage $V_{EXT}$ is in the neighborhood of 3.3 V, the output signal S4 of the 3.3V-system output buffer circuit 4 is derived from the terminal 6 as the signal $S_{OUT}$ after the level adjustment by the circuit 5. Accordingly, even if the value of the external supply voltage $V_{EXT}$ varies within the range from approximately 5 V to approximately 3.3 V, a desired fast and stable interface operation is realized.

Moreover, which one of the output signals S3 and S5 of the buffer circuits 3 and 5 is sent to the external output terminal 6 is automatically controlled or switched by the control signal S7a or S7b. Thus, no transistor switch is required for switching between the output signals S3 and S5. This means that chip-size increase of the LSI 100 is prevented.

Concrete Example of the Output Interface Circuit

Figure 3:
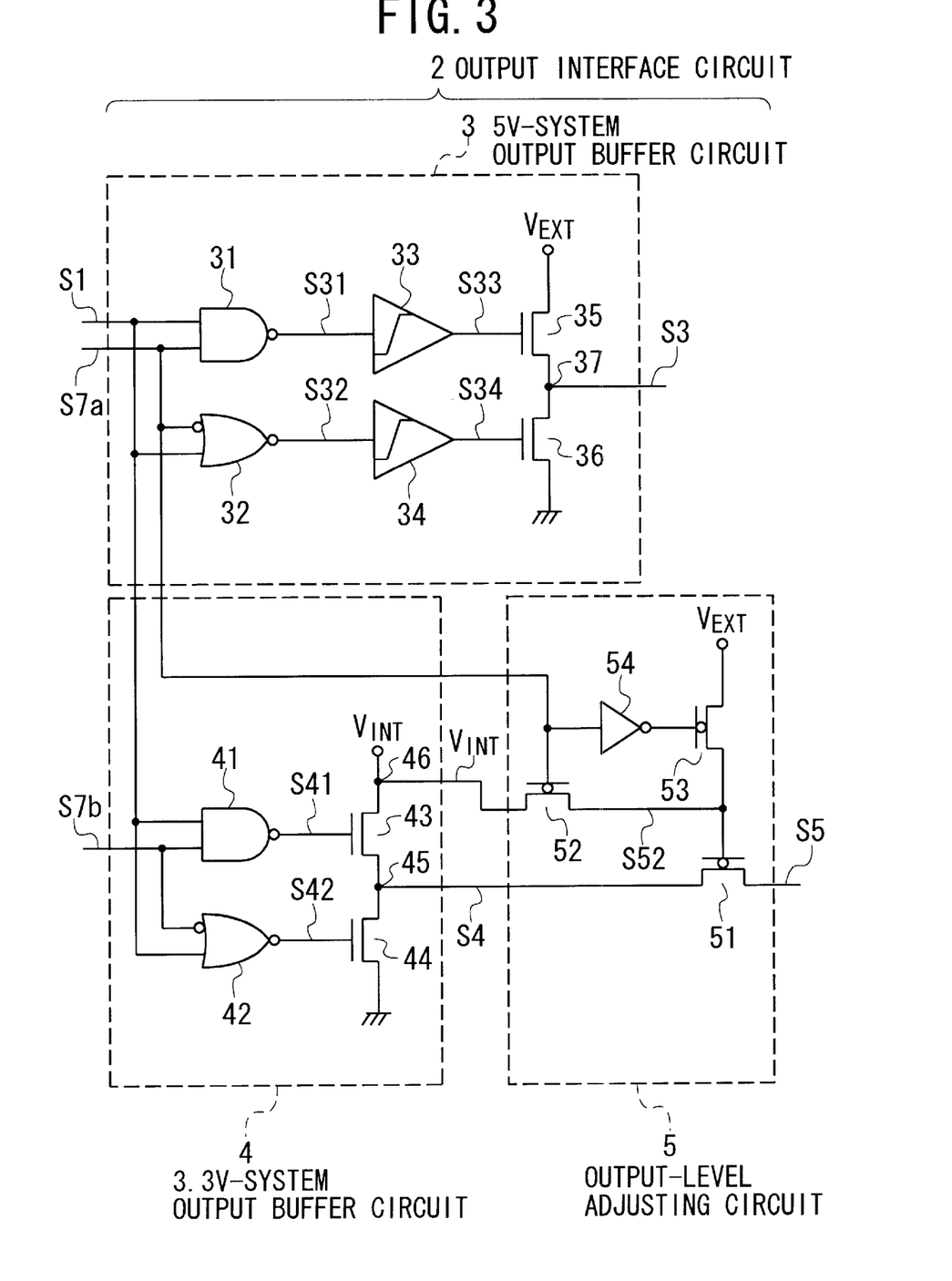
FIG. 3 is a circuit diagram showing an example of the concrete circuit configuration of the output interface circuit according to the first embodiment of FIG. 2.

FIG. 3 shows an example of the concrete circuit configuration of the output interface circuit 2 according to the first embodiment of FIG. 2.

First, the configuration of the 5V-system output buffer circuit 3 is explained below.

The 5V-system output buffer circuit 3 comprises a p-side control circuit 31, a n-side control circuit 32, a p-side level shifter circuit 33, a n-side level shifter circuit 34, a p-channel MOSFET 35, and a n-channel MOSFET 36. The MOSFETs 35 and 36 constitute a Complementary MOS (CMOS) inverter.

Here, the p-side control circuit 31 is composed of a NAND circuit. The circuit 31 receives the input signal to the 5V-system output buffer circuit 3 (i.e., the output signal S1 from the internal circuit 1) and the control signal S7a for enabling the 5V-system buffer circuit 3. Then, the circuit 31 outputs its output signal S31 to the p-side level shifter circuit 33. The output signal S31 is in the logic low (L) state when both the signals S1 and S7a are in the logic high (H) state. The signal S31 is in the logic H state when either the signal S1 or S7a is in the logic L state.

Hereinafter, the "logic high (H) state" and the "logic low (L) state" may be respectively referred simply as the "H state" and the "L state".

The p-side level shifter circuit 33 receives the output signal S31 of the p-side control circuit 31 and adjusts the level of the signal S31 thus received in such a way as to have a logic swing equal to the external supply voltage $V_{EXT}$. Thereafter, the circuit 33 outputs the level-adjusted one of the signal S31 to the gate of the p-channel MOSFET 35 as the output signal S33.

The n-side control circuit 32 is composed of a NOR circuit. The circuit 32 receives the output signal Si from the internal circuit 1 and the control signal S7a and then, outputs the output signal S32 to the n-side level shifter circuit 34. The signal S32 is in the L level when the signal S1 is in the H level or the signal S7a is in the L level, or when the signal S1 is in the H level and the signal S7a is in the L level. The signal S32 is in the H level when the signal S1 is in the L level and the signal S7a is in the H level.

The n-side level shifter circuit 34 receives the output signal S32 of the n-side control circuit 32 and adjusts the level of the signal S32 thus received in such a way as to have a logic swing equal to the external supply voltage $V_{EXT}$. Thereafter, the circuit 34 outputs the level-adjusted one of the signal S32 to the gate of the n-channel MOSFET 36 as the output signal S34.

The source of the p-channel MOSFET 35 is connected to the power supply line applied with the external supply voltage $V_{EXT}$. The source of the n-channel MOSFET 36 is connected to the ground line. The drains of the MOSFETs 35 and 36 are coupled together at the connection point 37, from which the output signal S3 of the buffer circuit 3 is derived. The gate of the MOSFET 35 is applied with the output signal S33 of the level shifter circuit 33. The gate of the MOSFET 36 is applied with the output signal S34 of the level-shifter circuit 34.

As described above, the source and drain of the p-channel MOSFET 35 are connected to the power supply line of $V_{EXT}$ and the connection point 37, respectively. Therefore, the MOSFET 35 is turned on and kept in the ON (i.e., conducting) state only when the output signal S31 of the p-side controller circuit 31 is in he L state (i.e., when both the output signal S1 of the internal circuit 1 and the control signal S7a are in the H state).

The source and drain of the n-channel MOSFET 36 are connected to the ground line and the connection point 37, respectively. Therefore, the MOSFET 36 is turned on and kept in the ON state only when the output signal S32 of the n-side controller circuit 32 is in the H state (i.e., when the output signal S1 of the internal circuit 1 is in the L state and the control signal S7a is in the H state).

Thus, when both the output signal S1 and the control signal S7a are in the H state, the p-channel MOSFET 35 is in the ON state and the n-channel MOSFET 36 is in the OFF state (i.e., blocked). This means that in this state, the output signal S3 of the 5V-system buffer circuit 3 is in the H state and its voltage level is equal to the current value of the external supply voltage $V_{EXT}$.

When the output signal S1 is in the L state and the control signal S7a is in the H state, the p-channel MOSFET 35 is OFF the n-channel MOSFET 36 is ON. Therefore, the output signal S3 is in the L state and its amplitude is equal to the ground potential (=0 V) in this state.

When both the output signal S1 and the control signal S7a are in the L state, both the MOSFETs 35 and 36 are OFF. Therefore, the output signal S3 is in the high-impedance (Hi-Z) state in this state.

Next, the configuration of the 3.3V-system output buffer circuit 4 is explained.

The 3.3V-system output buffer circuit 4 comprises a p-side control circuit 41, a n-side control circuit 42, a p-channel MOSFET 43, and a n-channel MOSFET 44. The MOSFETs 43 and 44 constitute a CMOS inverter.

Here, the p-side control circuit 41 is composed of a NAND circuit. The circuit 41 receives the input signal to the 3.3V-system output buffer circuit 4 (i.e., the output signal S1 from the internal circuit 1) and the control signal S7b for enabling the 3.3V-system buffer circuit 4. Then, the circuit 41 outputs its output signal S41 to the gate of the p-channel MOSFET 43. The signal S41 is in the logic L state when both the output signal S1 and the control signal S7b are in the logic H state. The signal S41 is in the logic H state when either of the signal S1 or the signal S7b is in the logic L state.

The n-side control circuit 42 is composed of a NOR circuit. The circuit 42 receives the input signal to the 3.3V-system buffer circuit 4 (i.e., the output signal S1 from the internal circuit 1) and the control signal S7b for enabling the 3.3V-system buffer circuit 4. Then, the circuit 42 outputs its output signal S42 to the gate of the n-channel MOSFET 44. The signal S42 is in the L level when the output signal S1 is in the H level or the control signal S7b is in the L level, or when the signal S1 is in the H level and the signal S7b is in the L level. The signal S42 is in the H level when the signal S1 is in the L level and the signal S7b is in the H level.

The source of the p-channel MOSFET 43 is connected to the power supply line applied with the internal supply voltage $V_{INT}$ at the connection point 46, from which the internal supply voltage $V_{INT}$ is derived. The source of the n-channel MOSFET 44 is connected to the ground line. The drains of the MOSFETs 43 and 44 are coupled together at the connection point 45, from which the output signal S4 of the buffer circuit 4 is derived.

As described above, the source and drain of the p-channel MOSFET 43 are connected to the power supply line of $V_{INT}$ and the connection point 45, respectively. Therefore, the MOSFET 43 is turned on and kept in the ON state only when the output signal S41 of the p-side controller circuit 41 is in the L state, in other words, when both the output signal S1 of the internal circuit 1 and the control signal S7b for the 3.3V-system buffer circuit 4 are in the H state.

Moreover, the source and drain of the n-channel MOSFET 44 are connected to the ground line and the connection point 45, respectively. Therefore, the MOSFET 44 is turned on and kept in the ON state only when the output signal S42 of the n-side controller circuit 42 is in the H state, in other words, when the output signal S1 is in the L state and the control signal S7b is in the H state.

Thus, when both the output signal S1 and the control signal S7b are in the H state, the p-channel MOSFET 43 is ON and the n-channel MOSFET 44 is OFF. This means that in this state, the output signal S4 of the circuit 4 is in the H state and its logic swing is equal to the internal supply voltage $V_{INT}$.

When the output signal S1 is in the L state and the control signal S7b is in the H state, the p-channel MOSFET 43 is OFF and the n-channel MOSFET 44 is ON. Therefore, the output signal S4 of the circuit 4 is in the L state and its amplitude is equal to the ground potential (=0 V) in this state.

When both the output signal S1 and the control signal S7b are in the L state, or when the output signal S1 is in the H state and the control signal S7b is in the L state, both the p- and n-channel MOSFETs 43 and 44 are OFF. Therefore, the output signal S4 is in the high-impedance (Hi-Z) state in this state.

The p-channel MOSFET 35 in the 5V-system buffer circuit 3 and the p-channel MOSFET 43 in the 3.3V-system buffer circuit 4 are different in characteristics. Specifically, the gate withstand voltage, the source-drain withstand voltage, and the logic threshold value of the MOSFET 35 are higher than those of the MOSFET 43, respectively. This is because the MOSFET 35 is applied with the external supply voltage $V_{EXT}$ that may be higher than the internal supply voltage $V_{INT}$ of 3.3 V. The MOSFET 35 needs to withstand the voltage $V_{EXT}$ applied. The external supply voltage $V_{EXT}$ varies between approximately 5 V and approximately 3.3 V. The n-channel MOSFET 36 in the 5 V system buffer circuit 3 and the n-channel MOSFET 44 in the 3.3V system buffer circuit 4 have the same characteristic difference.

The configuration of the output-level adjusting circuit 5 is as follows.

The output-level adjusting circuit 5 comprises three undoped n-channel MOSFETs 51, 52, and 53 and an inverter 54. The two MOSFETs 52 and 53 and the inverter 54 are provided for controlling the operation of the MOSFET 51.

The drain of the MOSFET 51 is connected to the connection point 45 of the MOSFETs 43 and 44 of the 3.3V-system buffer circuit 4, to which the output signal S4 of the circuit 4 is applied. The source of the MOSFET 51 is connected to the external output terminal 6 of the LSI 100, from which the output signal S5 of the output-level shifter circuit 5 is derived.

The gate of the MOSFET 51 is connected to the connection point 46 of the buffer circuit 4 by way of the MOSFET 52. Thus, the gate of the MOSFET 51 is applied with the internal supply voltage $V_{INT}$ when the MOSFET 52 is ON. The gate of the MOSFET 51 is also connected to the power supply line applied with the external supply voltage $V_{EXT}$ by way of the MOSFET 53. Thus, the gate of the MOSFET 51 is applied with the external supply voltage $V_{EXT}$ when the MOSFET 53 is ON.

The drain of the MOSFET 52 is connected to the connection point 46 in the buffer circuit 4, to which the internal supply voltage $V_{INT}$ is applied. The source of the MOSFET 52 is connected to the gate of the MOSFET 51, to which the control signal S7$a$ for enabling the circuit 3 is applied. The MOSFET 52 is turned ON or OFF when the signal S7$a$ is in the H or L state, respectively.

The drain of the MOSFET 53 is connected to the power supply line to which the external supply voltage $V_{EXT}$ is applied. The source of the MOSFET 53 is connected to the gate of the MOSFET 51. The gate of the MOSFET 53 is applied with the control signal S7$a$ by way of the inverter 54. Thus, the MOSFET 53 performs an opposite operation to the MOSFET 52. Specifically, the MOSFET 53 is turned OFF when the signal S7$a$ is in the H state and turned ON when the signal S7$a$ is in the L state.

As described above, when the control signal S7$a$ is in the H state, the MOSFET 52 is ON and the MOSFET 53 is OFF and therefore, the gate of the MOSFET 51 is applied with the internal supply voltage $V_{INT}$ by way of the point 46. As a result, the output signal S4 with a value of $V_{INT}$ or 0 is applied to the drain of the MOSFET 51. This means that even if the external supply voltage $V_{EXT}$ is one of the 5V-system voltages (i.e., 5 V or its neighborhood), the voltage applied to the output terminal or point 45 of the 3.3V-system buffer circuit 4 is kept to be equal to or lower than the internal supply voltage $V_{INT}$ (=3.3 V)

On the other hand, when the control signal S7$a$ is in the L state, the MOSFET 52 is OFF and the MOSFET 53 is ON and therefore, the gate of the MOSFET 51 is applied with the external supply voltage $V_{EXT}$ by way of the MOSFET 53. As a result, in this case also, the output signal S4 with a value of $V_{INT}$ or 0 is applied to the drain of the MOSFET 51. This means that the voltage applied to the output terminal 45 of the buffer circuit 4 is kept to be equal to or lower than the internal supply voltage $V_{INT}$.

Operation of Output Interface Circuit of FIG. 3

Figure 4:
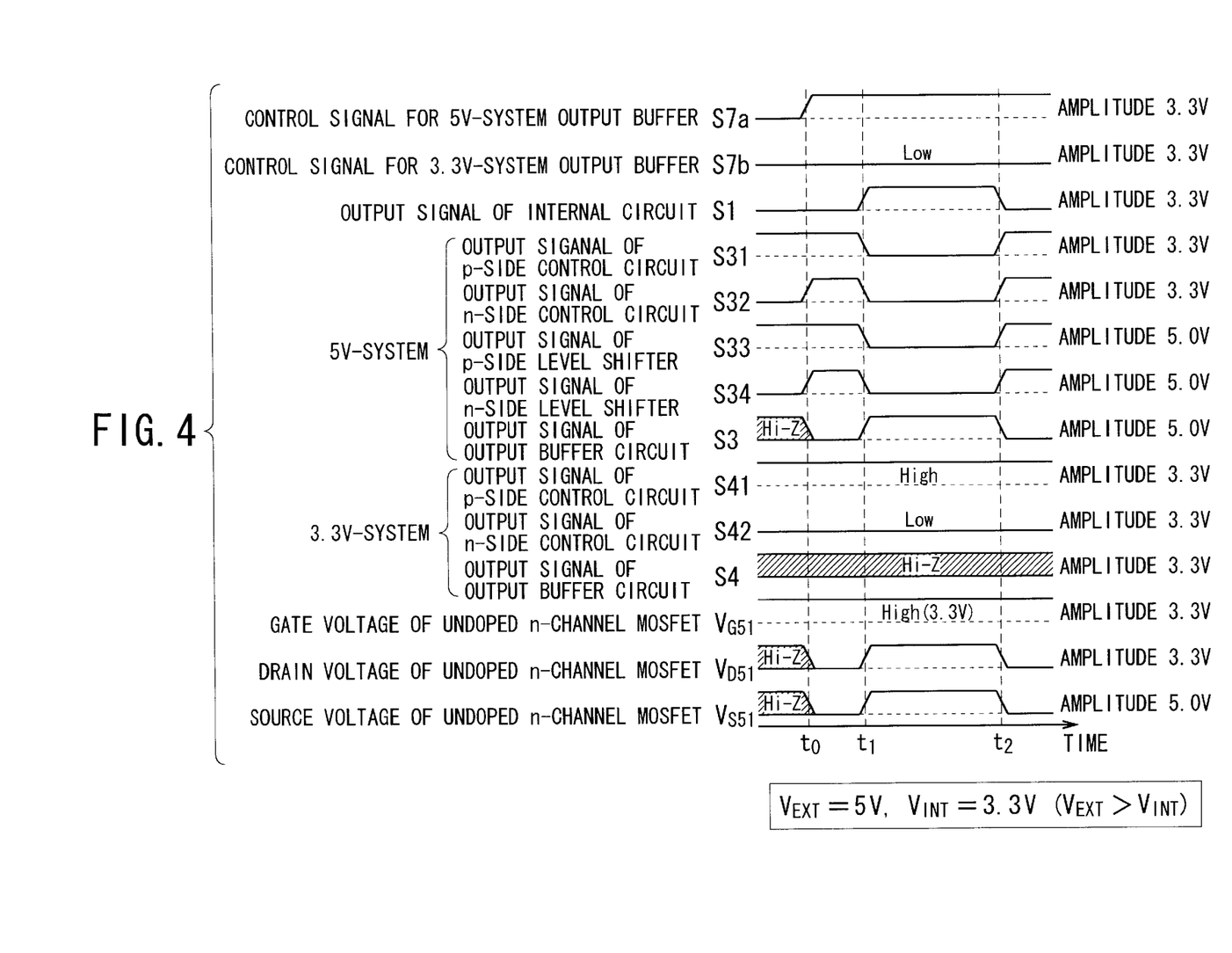
FIG. 4 is a timing diagram showing the operation of the output interface circuit according to the first embodiment of FIG. 2 when the external supply voltage is greater than the internal supply voltage (i.e., $V_{EXT} > V_{INT}$).
Figure 5:
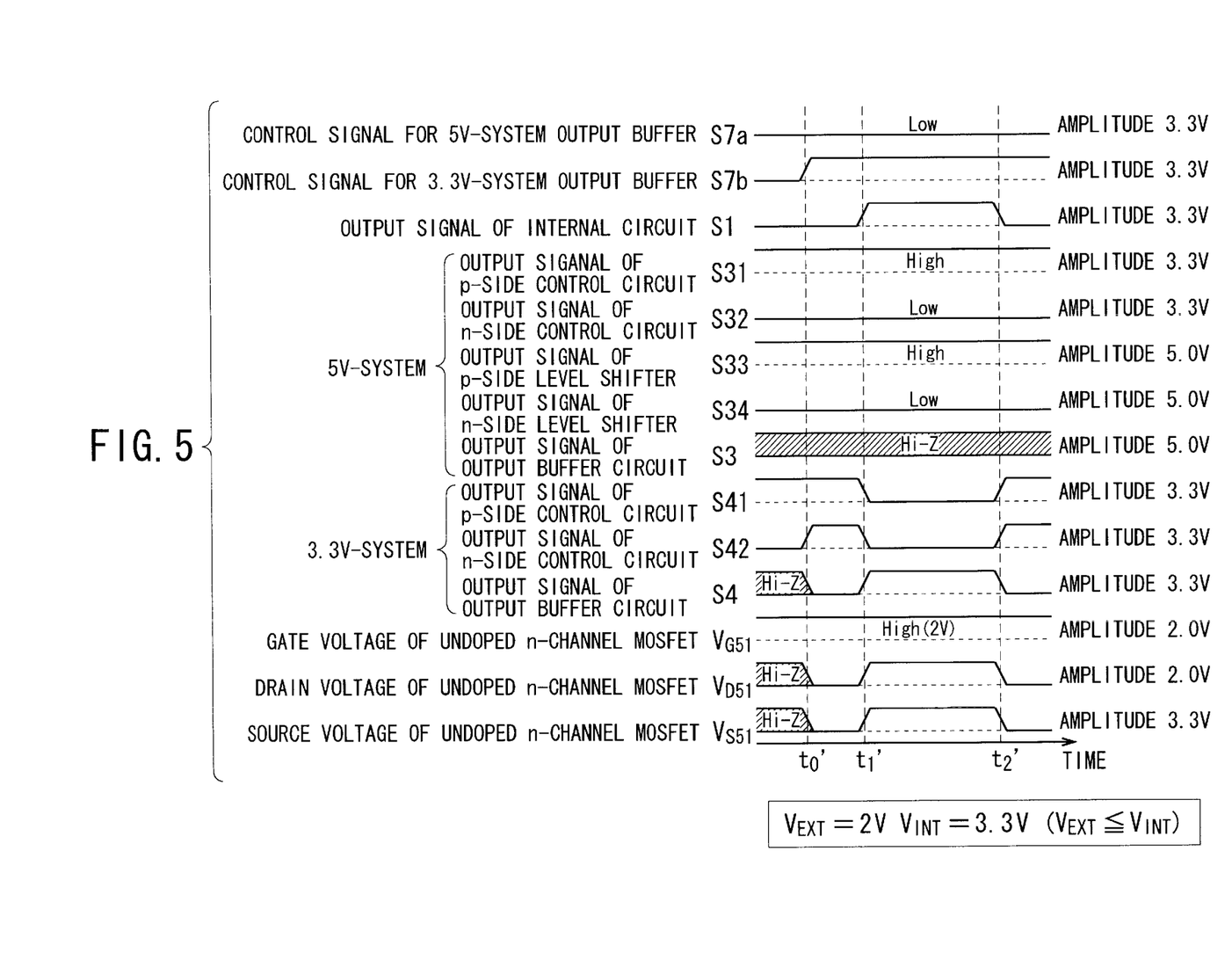
FIG. 5 is a timing diagram showing the operation of the output interface circuit according to the first embodiment of FIG. 2 when the external supply voltage is less than or equal to the internal supply voltage (i.e., $V_{EXT} \leq V_{INT}$).

Next, the operation of the output interface circuit 2 having the configuration of FIG. 3 is explained below in detail with reference to the timing diagrams shown in FIGS. 4 and 5.

The operation of the interface circuit 2 differs dependent on whether the external supply voltage $V_{EXT}$ is greater than the internal supply voltage $V_{INT}$ (i.e., $V_{EXT} > V_{INT}$) or the external supply voltage $V_{EXT}$ is equal to or less than the internal supply voltage $V_{INT}$ (i.e., $V_{EXT} \leq V_{INT}$). Therefore, first, the operation at $V_{EXT} >) V_{INT}$ is explained with reference to FIG. 4 and then, the operation at $V_{EXT} \leq V_{INT}$ is explained with reference to FIG. 5.

Operation at $V_{EXT} > V_{INT}$

Here, it is supposed that $V_{EXT}$=5 V and $V_{INT}$ =3.3 V, which satisfy the relationship of $V_{EXT} > V_{INT}$. The other supposition is as follows:

The output signal S1 of the internal circuit 1 is at the L level (i.e., the logic L state) at and before the time to, is turned to the H level (i.e., the logic H state) at the time t1 subsequent to $t_o$, and is returned to the L level at the time $t_2$ subsequent to $t_1$. The control signals S7$a$ and S7$b$ are at the L level prior to the time to. The signals S1, S7$a$, and S7$b$ have the same amplitude (i.e., the same logic swing) of 3.3 V.

When the external supply voltage $V_{EXT}$ of 5V is supplied to the LSI 100, the information or data representing the fact that the current value or state of the voltage $V_{EXT}$ is one of the 5V-system voltages is sent and stored in the external power supply state register 7 by a known method. The control signal S7$a$ for the 5V-system buffer circuit 3 is set at the H level at the time to. At this time, the control signal S7$b$ for the 3.3V-system buffer circuit 4 is set at the L level and thereafter, the same state is kept unchanged.

Accordingly, in the 5V-system output buffer circuit 3, the output signal S31 of the p-side controller circuit 31 is kept at the H level while the output signal S32 of the n-side controller circuit 32 is turned from the L level to the H level at the time to. Since the logic swings (i.e., the amplitudes) of the signals S31 and S32 are both 3.3 V, they are insufficient to switch the MOSFETs 35 and 36 with respect to the external supply voltage $V_{EXT}$ (=5 V). So, the p- and n-side level-shifter circuits 33 and 34 amplify respectively the signals S31 and S32, thereby increasing the amplitudes of the signals S31 and S32. Thus, the circuits 33 and 34 output their output signals S33 and S34 with the same amplitude of 5V, respectively. For this reason, at the time to, the p-channel MOSFET 35 is turned OFF while the n-channel MOSFET 36 is turned ON, thereby turning the output signal S3 of the buffer circuit 3 from the Hi-Z state to the L level.

On the other hand, in the 3.3V-system output buffer circuit 4, the control signal S7$b$ is kept at the L level before and after the time to. Therefore, the output signal S41 of the p-side controller circuit 41 is kept at the H level while the output signal S42 of the n-side controller circuit 42 is kept at the L level. This means that at the time to, the p- and n-channel MOSFETs 43 and 44 are OFF, resulting in the output signal S4 of the buffer circuit 4 being kept in the Hi-Z state.

In the output-level adjusting circuit 5, since the control signal S7a is turned to the H level at the time to, the n-channel undoped MOSFET 52 is ON while the n-channel undopded MOSFET 53 is OFF. Thus, the gate voltage $V_{G51}$ of the n-channel undoped MOSFET 51 is kept at the internal supply voltage $V_{INT}$ (=3.3 V).

Additionally, the drain voltage $V_{D51}$ of the MOSFET 51 (i.e., the output signal S4 of the 3.3V-system buffer circuit 4) is turned from the Hi-Z state to the L level. Similarly, the source voltage $V_{S51}$ of the MOSFET 51 (i.e., the output signal S5 of the output-level adjusting circuit 5) is turned from the Hi-Z state to the L level.

Subsequently, at the time $t_1$, the input signal S1 is turned from the L level to the H level. At this time, both the output signals S31 and S32 of the p- and n-side controller circuits 31 and 32 are turned from the H level to the L level. Both the output signals S33 and S34 of the p- and n-side level-shifter circuits 33 and 34 are turned from the H level to the L level. Since the MOSFET 35 is turned ON and the MOSFET 36 is turned OFF at the time $t_1$, the output signal S3 of the 5V-system buffer circuit 3 is turned from the L level to the H level. The amplitude or logic swing of the signal S3 is equal to the external supply voltage $V_{EXT}$ of 5V.

On the other hand, in the 3.3V-system output buffer circuit 4, the control signal S7b is kept at the L level before and after the time $t_1$. Therefore, the output signal S41 of the p-side controller circuit 41 is kept at the H level while the output signal S42 of the n-side controller circuit 42 is kept at the L level. Thus, the output signal S4 of the buffer circuit 4 is kept in the Hi-Z state at the time $t_1$.

In the output-level adjusting circuit 5, since the enabling signal S7a is at the H level at the time $t_1$, the MOSFET 52 is ON while the MOSFET 53 is OFF. Thus, the gate voltage $V_{G51}$ of the MOSFET 51 is kept at the internal supply voltage $V_{INT}$ (=3.3 V).

At the time $t_1$, the drain voltage $V_{D51}$ of the MOSFET 51 (i.e., the output signal S4 of the buffer circuit 4) is turned from the L level to the H level. Similarly, the source voltage $V_{S51}$ of the MOSFET 51 (i.e., the output signal S5 of the output-level adjusting circuit 5) is turned from the L level to the H level. The amplitude or logic swing of the output signal S4 is equal to the internal supply voltage $V_{INT}$ (=3.3 V). The amplitude or logic swing of the output signal S5 is equal to the external supply voltage $V_{EXT}$ (=5 V).

Thereafter, the output signal S1 of the internal circuit 1 is turned from the H level to the L level again at the time $t_2$. At this time, the output signals S31 and S32 of the p- and n-side controller circuits 31 and 32 are turned from the L level to the H level in the buffer circuit 3. The output signals S33 and S34 of the p- and n-side level shifter circuits 33 and 34 are turned from the L level to the H level. Accordingly, at the time $t_2$, the p-channel MOSFET 35 is turned OFF while the n-channel MOSFET 36 is turned ON, resulting in the change of the output signal S3 of the buffer circuit 3 from the H level to the L level.

In the buffer circuit 4, the control signal S7b is kept at the L level before and after the time $t_2$ and therefore, the output signal S41 of the p-side controller circuit 41 is kept in the H level while the output signal S42 of the n-side controller circuit 42 is kept in the L level. Accordingly, even at the time $t_2$, the output signal S4 of the buffer circuit 4 is kept in the Hi-Z state.

In the output-level adjusting circuit 5, the enabling signal S7a is at the H level at the time $t_2$ and therefore, the MOSFET 52 is ON while the MOSFET 53 is OFF. Thus, the gate voltage $V_{G51}$ of the MOSFET 51 is kept at the internal supply voltage $V_{INT}$ (=3.3 V).

The drain voltage $V_{D51}$ of the MOSFET 51 (i.e., the output signal S4 of the buffer circuit 4) is turned from the H level to the L level at the time $t_2$. Similarly, the source voltage $V_{S51}$ of the MOSFET 51 (i.e., the output signal S5 of the output-level adjusting circuit 5) is turned from the H level to the L level.

Operation at $V_{EXT} \leq V_{INT}$

It is supposed that $V_{EXT}$ =2 V and $V_{INT}$ =3.3 V, which satisfy the relationship of $V_{EXT} \leq V_{INT}$. The other supposition is as follows:

The output signal S1 of the internal circuit 1 is kept at the L level at and before the time $t_0'$, is turned to the H level r at the time $t_1'$ subsequent to $t_0'$, and is returned to the L level at the time $t_2'$ subsequent to $t_1'$. The control signals S7a and S7b are both at the L level prior to the time $t_0'$. The signals S1, S7a, and S7b have the same amplitude or logic swing of 3.3 V.

When the external supply voltage $V_{EXT}$ of 2V is supplied to the LSI 100, the information or data representing the fact that the current state or value of the voltage $V_{EXT}$ is one of the 3.3V-system voltages is sent and stored in the external power supply state register 7 by a known method. The control signal S7b for the 3.3V-system buffer circuit 4 is set at the H level at the time $t_0'$. At this time, the control signal S7a for the 5V-system buffer circuit 3 is at the L level and thereafter, the same state is kept unchanged.

Accordingly, in the 5V-system output buffer circuit 3, the output signal S31 of the p-side controller circuit 31 is kept at the H level while the output signal S32 of the n-side controller circuit 32 is kept at the L level at the time $t_0'$. Similarly, the output signals S33 and S34 of the level shifter circuits 33 and 34 are kept at the H and L levels, respectively. Thus, at the time $t_0'$, both the p- and n-channel MOSFETs 35 and 36 are OFF and therefore, the output signal S3 of the buffer circuit 3 is kept in the Hi-Z state.

On the other hand, in the 3.3V-system output buffer circuit 4, the control signal S7b is turned from the L level to the H level at the time $t_0'$. Thus, the output signal S41 of the p-side controller circuit 41 is kept at the H level while the output signal S42 of the n-side controller circuit 42 is turned from the L level to the H level. As a result, at the time $t_0'$, the p-channel MOSFET 43 is OFF while the n-channel MOSFET 44 is ON, resulting in the change of the output signal S4 of the buffer circuit 4 from the Hi-Z state to the L level.

In the output-level adjusting circuit 5, since the control signal S7a is at the L level at the time $t_0'$, the MOSFET 52 is OFF and the MOSFET 53 is ON. Thus, the gate voltage $V_{G51}$ of the MOSFET 51 is kept at the external supply voltage $V_{EXT}$ (=2 V).

Additionally, at the time $t_0'$, the drain voltage $V_{D51}$ of the MOSFET 51 (i.e., the output signal S4 of the buffer circuit 4) is turned from the Hi-Z state to the L level. Similarly, the source voltage $V_{S51}$ of the MOSFET 51 (i.e., the output signal S5 of the output-level adjusting circuit 5) is turned from the Hi-Z state to the L level.

Subsequently, at the time $t_1'$, the output signal S1 of the internal circuit 1 is turned from the L level to the H level. At this time, the output signal S31 of the p-side controller circuit 31 is kept at the H level while the output signal S32 of the n-side controller circuit 32 is kept at the L level. The output signals S33 and S34 of the p- and n-side level-shifter circuits 33 and 34 are kept at the H level and the L level, respectively. Thus, both the MOSFETs 35 and 36 are kept OFF at the time $t_1$, keeping the output signal S3 of the buffer circuit 3 in the Hi-Z state.

On the other hand, in the 3.3V-system output buffer circuit 4, the control signal S7b is kept at the H level before and after the time $t_1$ and therefore, both the output signals S41 and S42 of the controller circuits 41 and 42 are turned from the H level to the L level. Thus, at the time $t_1'$, the MOSFET 43 is ON and the MOSFET 44 is OFF, turning the output signal S4 of the buffer circuit 4 from L level to the H level. The amplitude or logic swing of the output signal S4 is equal to the internal supply voltage $V_{INT}$ (=3.3 V).

In the output-level adjusting circuit 5, since the control signal S7a is kept at the L level even at the time $t_1'$, the MOSFET 52 is OFF and the MOSFET 53 is ON. Thus, the gate voltage $V_{G51}$ of the MOSFET 51 is kept at the external supply voltage $V_{EXT}$ (=2 V).

The source voltage $V_{S51}$ of the MOSFET 51 (i.e., the output signal S4 of the buffer circuit 4) is turned from the L level to the H level at the time $t_1'$. Similarly, the drain voltage $V_{D51}$ of the MOSFET 51 (i.e., the output signal S5 of the output-level adjusting circuit 5) is turned from the L level to the H level. The amplitude or logic swing of the output signal S4 is equal to the internal supply voltage $V_{INT}$ (=3.3 V) while that of the output signal S5 is equal to the external supply voltage $V_{EXT}$ (=2 V).

Thereafter, the output signal S1 is turned from the H level to the L level again at the time $t_2'$. At this time, all the signals are kept unchanged in the 5V-system buffer circuit 3 at the time $t_2'$ and accordingly, the output signal S3 of the buffer circuit 3 is kept in the Hi-Z state.

In the buffer circuit 4, at the time $t_2'$, the control signal S7b is kept at the H level. Therefore, both the output signals S41 and S42 of the controller circuits 41 and 42 are turned from the L level to the H level. Accordingly, the MOSFET 43 is OFF and the MOSFET 44 is ON, resulting in the change of the output signal S4 of the buffer circuit 4 from the H level to the L level at the time $t_2'$.

In the output-level adjusting circuit 5, the control signal S7b is kept at the L level even at the time $t_2'$ and therefore, the MOSFET 52 is kept OFF and the MOSFET 53 is kept ON. Thus, the gate voltage $V_{G51}$ of the MOSFET 51 is kept at the external supply voltage $V_{EXT}$ (=2 V).

The source voltage $V_{S51}$ of the MOSFET 51 (i.e., the output signal S4 of the buffer circuit 4) is turned from the H level to the L level at the time $t_2'$. Similarly, the drain voltage $V_{D51}$ of the MOSFET 51 (i.e., the output signal S5 of the output-level adjusting circuit 5) is turned from the H level to the L level.

As explained in detail in the cases of $V_{EXT} > V_{INT}$ and $V_{EXT} < V_{INT}$, with the output interface circuit 2 according to the first embodiment, the control signal S7a for the 5V-system buffer circuit 3 and the control signal S7b for the 3.3V-system buffer circuit 4 are alternately used in response to the current value of the external supply voltage $V_{EXT}$. Specifically, when $V_{EXT} > V_{INT}$, the signal S7a is activated to use the 5V-system buffer circuit 3 while the 3.3V-system buffer circuit 4 and the output-level adjusting circuit 5 are inactivated. When $V_{EXT} \leq V_{INT}$, the signal S7b is activated to use the 3.3V-system buffer circuit 4 and the output-level adjusting circuit 5 while inactivating the 5V-system buffer circuit 3. Thus, the buffer circuits 3 and 4, which are operable fast and stably, are alternately operated by way of the control signals S7a and S7b. Accordingly, even if the value of the external supply voltage $V_{EXT}$ is decreased from 5 V to a value lower than the internal supply voltage $V_{INT}$ of 3.3 V, a fast and stable interface operation is realized. Moreover, since the buffer circuits 3 and 4 are switched by the control signals S7a and S7b, there is no need to provide a transistor switch for this purpose. This means that chip-size increase of the LSI 100 is prevented.

When the external supply voltage $V_{EXT}$ is one of the 3.3-V system voltages (i.e., in the neighborhood of 3.3 V or 2 V) and the 3.3V-system buffer circuit 4 is used or activated, the voltage value of the output signal S4 of the circuit 4 is lowered to a proper one by the output-level adjusting circuit 5. Therefore, even if the external supply voltage $V_{EXT}$ (=2 V) is lower than the internal supply voltage $V_{INT}$ (=3.3 V), there is no possibility that the value of the output signal $S_{OUT}$ of the LSI 100 (i.e., the output signal S5) is higher than the external supply voltage $V_{EXT}$ (=2 V).

Furthermore, when the external supply voltage $V_{EXT}$ (=5 V) is higher than the internal supply voltage $V_{INT}$ (=3.3 V), the voltage applied to the output terminal of the buffer circuit 4 (i.e., the connection point 45 of the MOSFETs 43 and 44) is lowered to the internal supply voltage $V_{INT}$ by the output-level adjusting circuit 5. Therefore, even if the buffer circuit 3 is used or activated, there is no possibility that a voltage higher than the internal supply voltage $V_{INT}$ (=3.3 V) is applied to the output terminal of the buffer circuit 4 (i.e., the connection point 45).

Confirmation Tests

To confirm the effects and advantages of the output interface circuit 2 according to the first embodiment of FIGS. 2 and 3, the inventor fabricated the circuit 2 and carried out the following tests on the circuit 2. At the same time, the inventor fabricated the prior-art output interface circuit 62 as explained with reference to FIG. 1 and carried out the same tests as the circuit 2 thereon. The results of these tests are shown in FIG. 6.

Figure 6:
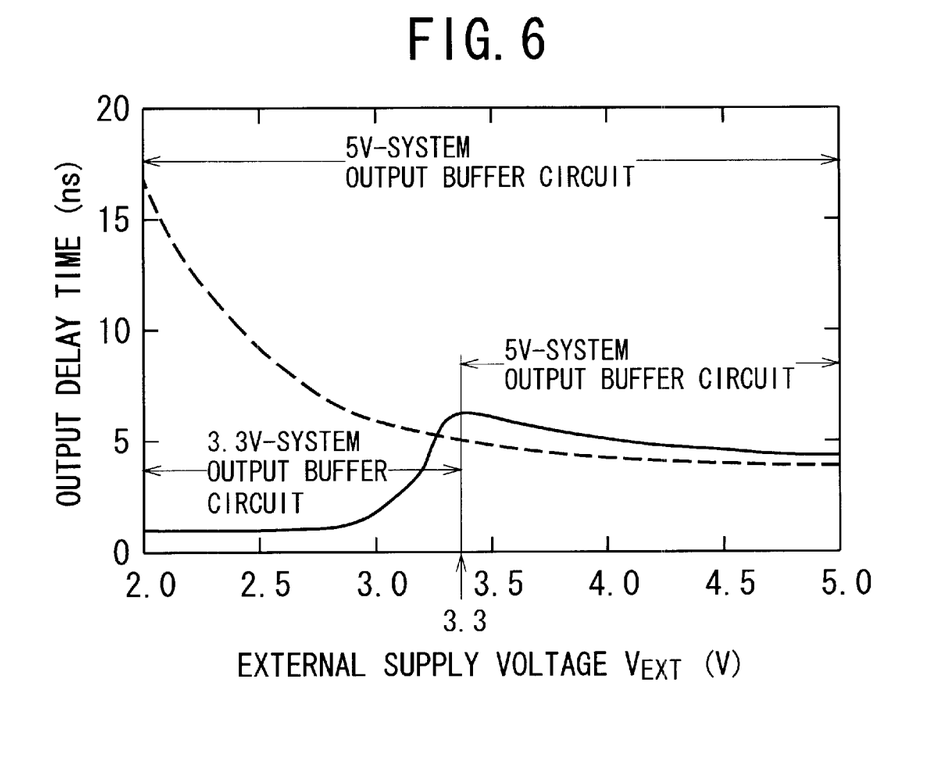
FIG. 6 is a graph showing the change of the output delay time with respect to the change of the external supply voltage of the output interface circuit according to the first embodiment of FIG. 2 and the prior-art output interface circuit of FIG. 1.

FIG. 6 is a graph showing the change of the output delay time (ns) with respect to the change of the external supply voltage $V_{EXT}$ of the output interface circuit 2 according to the first embodiment and the prior-art output interface circuit 62. The solid line denotes the result of the inventive circuit 2 while the broken line denotes that of the prior-art circuit 62.

With the prior-art circuit 62, only the 5V-system buffer circuit 63 provided its interface function when the external supply voltage $V_{EXT}$ varied from 5 V to 2 V. Thus, when the voltage $V_{EXT}$ was in the range from 5 V to 3.3 V, the output delay time was approximately 5 ns, which was a good result. However, when the voltage $V_{EXT}$ was set to be lower than 3.3 V, the output delay time increased drastically. For example, when the voltage $V_{EXT}$ was 2 V, the output delay time was more than 15 ns, which was about three times the value of approximately 5 ns. This means that a desired interface function or operation was impossible for the entire range of the voltage $V_{EXT}$ from 5 V to 2 V.

Unlike this, with the circuit 2 of the first embodiment, when the voltage $V_{EXT}$ was in the range from 5 V to 3.3 V, the 5V-system buffer circuit 3 was used or activated and therefore, the output delay time was approximately 5 ns, which was a good result. When the voltage $V_{EXT}$ was in the range from 3.3 V to 2 V, the 3.3V-system buffer circuit 4 and the output-level adjusting circuit 5 were used or activated instead of the circuit 3 and therefore, the output delay time was approximately 5 ns or 2 ns, which was a good result also. This means that a desired interface function or operation was possible for the entire range of the voltage $V_{EXT}$ from 5 V to 2 V.

SECOND EMBODIMENT

Figure 7:
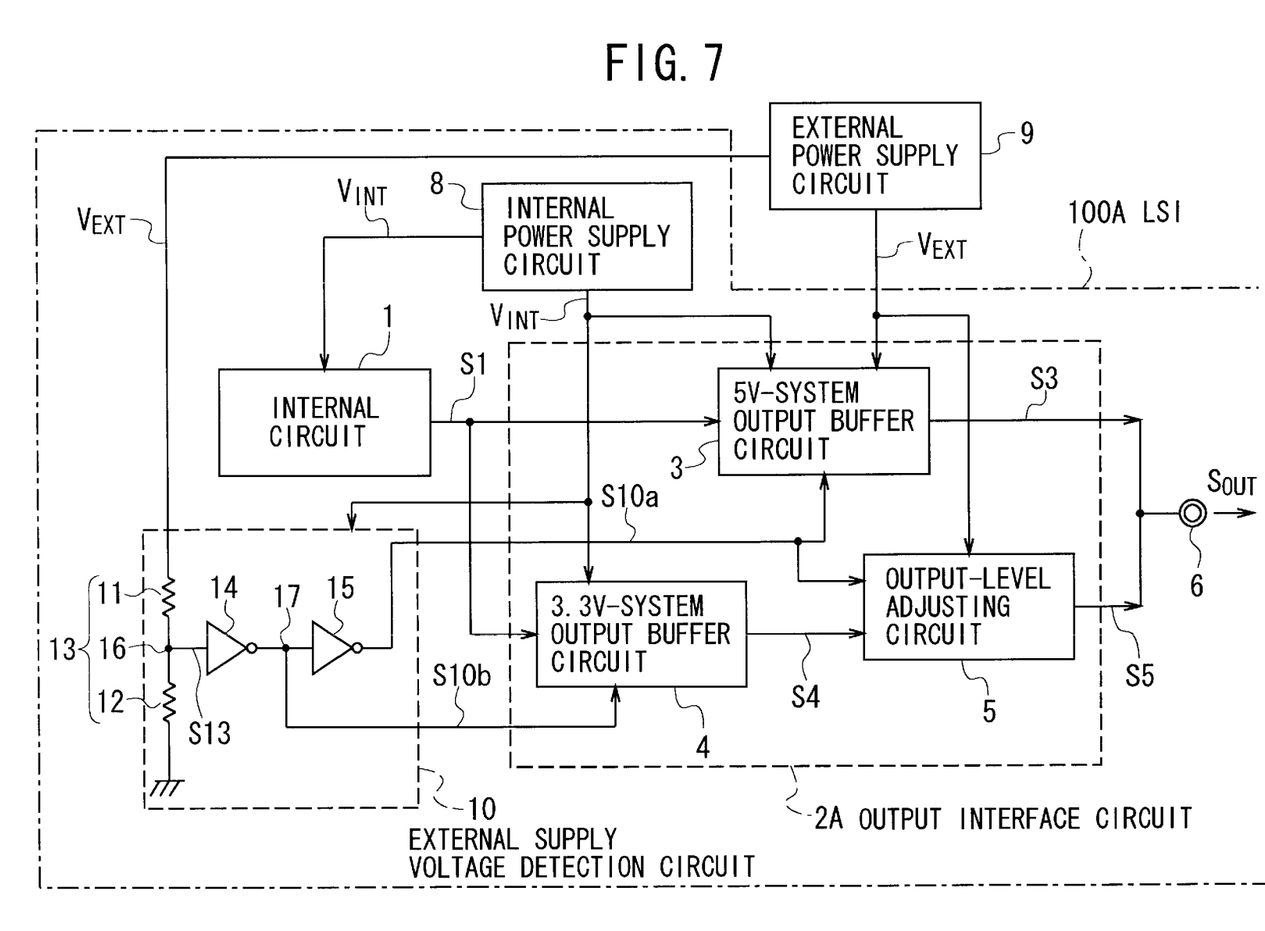
FIG. 7 is a functional block diagram showing the main part of a LSI including an output interface circuit according to a second embodiment of the invention.

FIG. 7 shows a LSI 100A including an output interface circuit 2A according to a second embodiment of the invention. The LSI 100A has the same configuration as the LSI 100 of the first embodiment of FIG. 2 except that the circuit 2A is included instead of the output interface circuit 2 of the first embodiment.

The output interface circuit 2A of the second embodiment has the same configuration as the output interface circuit 2 of the first embodiment other than that an external supply voltage detection circuit 10 is provided instead of the external power supply state register 7. Therefore, the explanation about the same configuration is omitted here by attaching the same reference symbols as those used in the first embodiment to the same elements in FIG. 7 for the sake of simplification.

The external supply voltage detection circuit 10 continuously detects the external supply voltage $V_{EXT}$. When the voltage $V_{EXT}$ is higher than 3.3 V, the circuit 10 sets the control signal S10a for enabling the 5V-system buffer circuit 3 in the logic H state and at the same time, it sets the control signal S10b for enabling the 3.3V-system buffer circuit 4 in the logic L state. On the other hand, when the voltage $V_{EXT}$ is equal to or lower than 3.3 V, the circuit 10 sets the control signal S10a in the logic L state and at the same time, it sets the control signal S10b in the logic H state. Thus, the circuit 10 does not require the information-writing signal S7c used for the register 7 in the circuit 2 of the first embodiment.

The detection circuit 10 operates under application of the external supply voltage $V_{EXT}$ supplied from the external power supply circuit 9.

With the output interface circuit 2A of the second embodiment, the external supply voltage $V_{EXT}$ is continuously detected or monitored by the detection circuit 10. Thus, even if the voltage $V_{EXT}$ gradually decreases during operation (like the LSI 100A is driven by a battery), the supply of the two control signals S10a and S10b is automatically controlled responsive to the current value of the voltage $V_{EXT}$. As a result, there is an additional advantage that a desired fast and stable interface operation is realized even in this case.

A concrete example of the detection circuit 10 is shown in FIG. 7. Specifically, the circuit 10 comprises a resistive voltage divider circuit 13 and two inverters 14 and 15. The voltage divider circuit 13 includes two resistors 11 and 12 connected in series at the connection point 16. The two terminals of the resistor 11 are connected to the external power supply circuit 9 and the connection point 16. The two terminals of the resistor 12 are connected to the connection point 16 and the ground line. The inverters 14 and 15 are connected in series at the connection point 17. The input and output terminals of the inverter 14 are connected to the connection points 16 and 17, respectively. The output terminal of the inverter 14 (i.e., the connection point 17) is further connected to the 3.3V-system buffer circuit 4. The control signal S10b is applied to the buffer circuit 4 from the point 17. The input terminal of the inverter 15 is connected to the output terminal of the inverter 14 and the point 17. The output terminal of the inverter 15 is connected to the 5V-system buffer circuit 3 and the output-level adjusting circuit 5. The control signal S10a is applied to the circuits 3 and 5 from the output terminal of the inverter 15.

The output voltage of the resistive voltage divider circuit 13, which is generated at the point 16, is generated by dividing the external supply voltage $V_{EXT}$ at the resistance ratio of the resistors 11 and 12. The output voltage of the circuit 13 is used as the input voltage of the inverter 14. The output voltage of the inverter 14, which is generated at the point 17, is used as the input voltage of the inverter 15. The output voltage of the inverter 14 serves as the control signal S10b for enabling the 3.3V-system buffer circuit 4. The output voltage of the inverter 15 serves as the control signal S10a for enabling the 5V-system buffer circuit 3.

Accordingly, the output voltage of the voltage divider circuit 13 (i.e., the input voltage of the inverter 14) is adjusted to have a desired value by suitably setting the resistance values of the resistors 11 and 12 of the circuit 13 according to the logic threshold value of the inverter 14. Thus, for example, when the external supply voltage $V_{EXT}$ is equal to or lower than 3.3 V, the control signal S10b for the circuit 4 can be set to be in the logic H state (i.e., at the H level). At the same time, when the external supply voltage $V_{EXT}$ is equal to or higher than 3.4 V, the signal S10b can be set to be in the logic L state (i.e., at the L level). In this case, the signal S10a is in the L state when the voltage $V_{EXT}$ is equal to or lower than 3.3 V and the signal S10a is in the H state when the voltage $V_{EXT}$ is equal to or higher than 3.4. As a result, a desired interface operation as described in the first embodiment is realized in the circuit 2A of the second embodiment.

VARIATIONS

It is needless to say that the invention is not limited to the above-described first and second embodiments. Any change may be added to these embodiments.

For example, the output buffer circuits 3 and 4 and the output-level adjusting circuit 5 have the configurations shown in FIG. 3 in the first and second embodiments. However, these circuits 3, 4, and 5 may have any other configurations if they have the same or similar functions as explained above.

Moreover, the external supply voltage $V_{EXT}$ fluctuates within the range of 5 V to 2 V while the internal supply voltage $V_{INT}$ is kept constant at 3.3V in the first and second embodiments. However, any other voltage values may be applied to the invention.

While the preferred forms of the present invention have been described, it is to be understood that modifications will be apparent to those skilled in the art without departing from the spirit of the invention. The scope of the present invention, therefore, is to be determined solely by the following claims.

What is claimed is:

1. An output interface circuit comprising:
   (a) a first output buffer circuit for receiving an output signal of an internal circuit to output a first output signal;
   (b) a second output buffer circuit for receiving the output signal of the internal circuit to output a second output signal; and
   (c) an output-level adjusting circuit for receiving the second output signal outputted from the second output buffer circuit and for adjusting a level of the second output signal thus received to output a third output signal corresponding to the second output signal to an external output terminal;
   wherein the first output buffer circuit outputs the first output signal to the external output terminal responsive to a first control signal that represents an external supply voltage having a first relationship with a specific value; and
   wherein the second output buffer circuit outputs the second output signal to the output-level adjusting circuit responsive to a second control signal that represents the external supply voltage having a second relationship with the specific value opposite to the first relationship, the first control signal and the second control signal bypassing the internal circuit.

2. The circuit according to claim 1, wherein the output-level adjusting circuit outputs the third output signal to the external output terminal responsive to the first or second control signal.

3. The circuit according to claim 1, wherein the output-level adjusting circuit has a function of equalizing a voltage level of the third output signal to the external supply voltage when the external supply voltage is lower than an internal supply voltage.

4. The circuit according to claim 1, wherein the output-level adjusting circuit has a function of adjusting a voltage level of the third output signal to be lower than an internal supply voltage.

5. The circuit according to claim 1, wherein the first output signal outputted from the first output buffer circuit is approximately equal to the external supply voltage while the second output signal outputted from the second output buffer circuit is approximately equal to an internal supply voltage.

6. The circuit according to claim 5, wherein the third output voltage outputted from the output-level adjusting circuit is approximately equal to the external supply voltage.

7. The circuit according to claim 1, wherein the first and second control signals are respectively sent to the first and second output buffer circuits by way of a register that stores a data on a current state of the external supply voltage.

8. The circuit according to claim 1, wherein the first and second control signals are respectively sent to the first and second output buffer circuits by way of a voltage detection circuit for continuously detecting a state of the external supply voltage.

9. An output interface circuit comprising:
(a) a first output buffer circuit for receiving an output signal of an internal circuit to output a first output signal;
(b) a second output buffer circuit for receiving the output signal of the internal circuit to output a second output signal; and
(c) an output-level adjusting circuit for receiving the second output signal outputted from the second output buffer circuit and for adjusting a level of the second output signal thus received to output a third output signal corresponding to the second output signal to an external output terminal;
wherein the first output buffer circuit outputs the first output signal to the external output terminal responsive to a first control signal that represents an external supply voltage having a first relationship with a specific value;
wherein the second output buffer circuit outputs the second output signal to the output-level adjusting circuit responsive to a second control signal that represents the external supply voltage having a second relationship with the specific value opposite to the first relationship;
wherein the first and second control signals are respectively sent to the first and second output buffer circuits by way of a voltage detection circuit for continuously detecting a state of the external supply voltage; and wherein the voltage detection circuit includes a resistive voltage divider and an inverter;
wherein the voltage divider divides the external supply voltage at a specific resistance ratio to generate one of the first and second control signals; and
wherein the inverter is used to generate the other of the first and second control signals.

10. The circuit according to claim 1, wherein the first output buffer circuit is operated under application of the external supply voltage and an internal supply voltage while the second output buffer circuit is operated under application of the internal supply voltage.

11. The circuit according to claim 1, wherein the output-level adjusting circuit outputs the third output signal responsive to the first control signal.

12. The circuit according to claim 1, wherein the first output signal outputted from the first output buffer circuit has a logic swing approximately equal to the external supply voltage; and
wherein the second output signal outputted from the second output buffer circuit has a logic swing approximately equal to an internal supply voltage.

13. An output interface circuit comprising:
(a) a first output buffer circuit for receiving an output signal of an internal circuit to output a first output signal;
(b) a second output buffer circuit for receiving the output signal of the internal circuit to output a second output signal; and
(c) an output-level adjusting circuit for receiving the second output signal outputted from the second output buffer circuit and for adjusting a level of the second output signal thus received to output a third output signal corresponding to the second output signal to an external output terminal;
wherein the first output buffer circuit outputs the first output signal to the external output terminal responsive to a first control signal that represents an external supply voltage having a first relationship with a specific value;
wherein the second output buffer circuit outputs the second output signal to the output-level adjusting circuit responsive to a second control signal that represents the external supply voltage having a second relationship with the specific value opposite to the first relationship; and
wherein the first output buffer circuit comprises a first logic circuit for receiving the output signal of the internal circuit and the first control signal, a second logic circuit for receiving the output signal of the internal circuit and the first control signal, and a first inverter driven by outputs of the first and second logic circuits; and
wherein the second output buffer circuit comprises a third logic circuit for receiving the output signal of the internal circuit and the second control signal, a fourth logic circuit for receiving the output signal of the internal circuit and the second control signal, and a second inverter driven by outputs of the third and fourth logic circuits.

* * * * *